United States Patent [19]

Love et al.

[11] 4,170,477

[45] Oct. 9, 1979

[54] METHOD FOR MAKING POLYSULFUR NITRIDE AND PRODUCT THEREOF

[75] Inventors: Peter Love; Mortimer M. Labes, both of Philadelphia, Pa.

[73] Assignee: Temple University, Philadelphia, Pa.

[21] Appl. No.: 912,481

[22] Filed: Jun. 5, 1978

[51] Int. Cl.$^2$ .............................................. B05D 3/06
[52] U.S. Cl. ................... 96/36.2; 423/406; 427/44; 427/53; 427/54; 428/538; 428/901; 204/157.1 R
[58] Field of Search .............................. 427/54, 53, 44; 423/406, 561 R, 562; 96/35.1, 36.2; 428/538, DIG. 901; 204/157.1 R

[56] References Cited

PUBLICATIONS

Mikulski et al., "J. Am. Chem. Soc.", V. 98, No. 13, Jun. 1976, pp. 3844–3848.
Iqbal et al, "Solid State Communications", 1976, vol. 20, pp. 1147–1150.
Love et al., "J. Chem. Soc. Chemical Communications", Apr. 1978, pp. 301–302.
Street and Greene, "IBM Journ. Res. and Dev.", Mar. 1977, pp. 99–109.
*Chemistry and Physics of One-Dimensioned Metals*, Edited by H. J. Keller, Plenum Publishing Co., New York, 1977, pp. 167–195.
Mikulski et al., "J. Am. Chem. Soc.", V. 97, No. 22, Oct. 1975, pp. 6358–6363.

*Primary Examiner*—John H. Newsome
*Attorney, Agent, or Firm*—Miller & Prestia

[57] ABSTRACT

Irradiation of collected $S_4N_4$ decomposition products with light or radiation in the $\gamma$ to visible range enhances the initiation of polymerization of the decomposition products to produce polysulfur nitride, which is typically conductive and usually referred to as $(SN)_x$. Irradiation of a masked coating of collected $S_4N_4$ decomposition products and completion of polymerization thereof and removal of non-irradiated, non-polymerized portions thereof will result in an electrically conductive coating disposed in a preselected pattern. $S_4N_4$ decomposition products may also be dispersed in a matrix, e.g. a photographic emulsion which is transparent or partially transparent to light, or which may be rendered partially or selectively transparent or opaque. This might be useful, for example, for imaging applications, or for producing a selectively transparent pattern for subsequent photoinduced initiation of polymerization of the $S_4N_4$ products.

11 Claims, No Drawings

METHOD FOR MAKING POLYSULFUR NITRIDE AND PRODUCT THEREOF

This invention pertains to an improved method for making polysulfur nitride, i.e. $(SN)_x$, and particularly to a method by which $(SN)_x$ may be produced in a preselected conductive pattern disposed on a non-conductive substrate.

BACKGROUND OF THE INVENTION

For many years it has been known that $(SN)_x$ may be produced by polymerization of the products of thermal pyrolysis of $S_4N_4$ in the presence of hot silver wire. Though it has been suggested that this polymerization occurs spontaneously, a more accurate statement is that the polymerization occurs spontaneously at sufficiently high temperatures, i.e. about 0° C. and above and the rate of polymerization is generally directly proportional to temperature.

It has also been previously reported that $(SN)_x$ is a conductive polymer and resembles certain metals in that it exhibits superconductive properties at ultra-low temperatures.

These general properties of $(SN)_x$ and a more complete background description of the history of research on $(SN)_x$, the methods of making $(SN)_x$ and the characterization thereof may be found in the publications, Preparation and Properties of $(SN)_x$—Street and Greene, IBM Journal Research and Development, March, 1977, pages 99–109 and Electronic Properties of The Superconducting Polymer $(SN)_x$, Greene and Street, CHEMISTRY AND PHYSICS OF ONE-DIMENSIONAL METALS (1977), edited by H. J. Keller and published by Plenum Publishing Corporation, 227 West 17th Street, New York, New York 10011, pages 167–195.

Reference should also be made to Synthesis and Structure of Metallic Polymeric Sulfur Nitride $(SN)_x$, and Its Precursor, Disulfur Dinitride, $S_2N_2$, Mikulski, Russo, Saran, MacDiarmid, Garito and Heeger, Journal of the American Chemical Society/97:22/October 29, 1975, pages 6358–6363. Mikulski et al describe precise analytical techniques used to characterize $(SN)_x$ polymer and refer specifically to X-ray bombardment for analytical purposes of $(SN)_x$. Similar analysis and techniques, as well as a characterization of $S_2N_2$ using X-ray bombardment is described in another publication by many of the same authors, Solid State Polymerization of $S_2N_2$ to $(SN)_x$, Journal of the American Chemical Society/98:13/June 23, 1976, pages 3844–3848.

This publication also indicates the presence of free radicals early in the polymerization process and a decrease thereof with time. (Page 3846, Column 1, last paragraph).

Another publication of interest is Raman Scattering and Optical Absorption In $S_2N_2$ And Partially Polymerized $S_2N_2$ Films—Iqbal and Downs, Solid State Communications, Vol. 20, pages 1147–1150, 1976. In this publication, it is reported that films of $S_2N_2$ are polmerized "by raising the temperature" of the material. It is also indicated that in attempted spectral analysis of the $S_2N_2$ film, the film "became light blue at the point of incidence of the 632.8 nm laser radiation, probably due to the formation of NS radical or short chain species in $S_2N_2$. [Reference is made here to the first above-mentioned Mikulski et al publication.] The coloration was more intense with the Ar laser lines and therefore complete spectra were recorded only with 632.8 nm radiation." (Page 1148, Column 2 beginning at line 3)

Finally, it should be noted that other publications have indicated the photoinitiated polymerization of other polymer systems, particularly such conventional polymers as polymethyl methacrylate by the use of ultraviolet and gamma irradiation. High-Resolution Polymer Replication of Metallic Patterns—Hiraoka, preprint of paper presented at the 175th Meeting of the American Chemical Society, Division of Organic Coatings and Plastics Chemistry, Anaheim, Calif., Mar. 12–17, 1978.

As a more complete description of the state of background knowledge concerning the present invention, the foregoing publications are incorporated herein by reference.

At a "Conference on Synthesis and Properties of Low-Dimensional Materials" sponsored by the New York Academy of Sciences of June 13–16, 1977, applicants herein, together with other co-authors, presented a paper entitled "$(SN)_x$ Grown Under Unusual Conditions" in which the growth of $(SN)_x$ crystals from different thermolysis products of $S_4N_4$ was described. That paper included an observation that "crystals of $S_2N_2$ in tetrahydrofuran are stable in the dark at temperatures below $-25°$. However, upon irradiation with a weak tungsten source (a microscope illuminator), these transparent crystals attain a dark color within about 30 seconds at temperatures as low as $-60°$, i.e. polymerization is photo-induced." (Emphasis in original).

Still further, applicants herein, together with other co-authors, have published in the *Journal of The Chemical Society Chemical Communications*, April 5, 1978, a paper entitled "Photopolymerization of $S_2N_2$ to $(SN)_x$." Copies of these papers are filed with the present application and the substance thereof is incorporated herein by reference.

Notwithstanding the state of knowledge concerning $(SN)_x$ polymers as evidenced by the foregoing, the art has heretofore lacked any means for enhancing initiation of polymerization of $(SN)_x$ polymers or for differentially enhancing polymerization so as to produce a conductive pattern of such polymer on a non-conductive substrate. Such product might find use, for example, as an alternative to conventional printed circuit boards.

BRIEF DESCRIPTION OF THE PRESENT INVENTION

The general objective of the present invention then is to provide an improved process for making $(SN)_x$ polymers and particularly to provide a method for initiating and/or enhancing polymerization thereof so as to accelerate polymerization or to facilitate selective polymerization.

According to this invention, the conventional method of making $(SN)_x$ by thermally decomposing $S_4N_4$ in the presence of silver wool, after which the decomposition products are collected and held at a sufficiently high temperature for a sufficient period of time to permit substantially complete polymerization thereof, is improved by irradiating the decomposition products with light or radiation in the $\gamma$ to visible range to enhance and/or to initiate polymerization. Thereafter the irradiated material is held at a sufficient temperature for a sufficient time, as in conventional $(SN)_x$ polymerization processes, to permit the polymerization reaction to go to completion.

Preferably, a substantially clear $S_2N_2$ fraction of $S_4N_4$ decomposition products is separated from the decomposition products and collected for subsequent irradiation.

The collected $S_4N_4$ decomposition products may be disposed in coating form on an electrically non-conductive substrate and irradiated at a sufficiently low temperature to inhibit spontaneous polymerization. Such irradiation may be conducted through an irradiation mask so as to selectively initiate polymerization in a limited and preselected portion or pattern of the coated substrate. Alternatively, $S_4N_4$ decomposition products may also be dispersed in a matrix, e.g. a photographic emulsion which is transparent or partially transparent to light or which may be rendered partially or selectively transparent or opaque. This might be useful, for example, for imaging applications, or for producing a selectively transparent pattern for subsequent photoinduced initiation of polymerization of the $S_4N_4$ products.

DETAILED DESCRIPTION OF THE PRESENT INVENTION

For a better understanding of the present invention, reference is made to the following detailed description thereof, taken in conjunction with the appended claims.

The thermal decomposition, or thermolysis, of $S_4N_4$ in the presence of silver wool typically produces several products, of which the primary product is clear or transparent $S_2N_2$. Other products which have been identified are a deep red monomer, tentatively identified as SN. and a dark brown product. It is believed that all of these decomposition products polymerize although some may polymerize in different ways and to different degrees than others and some may be more receptive to photoinduced polymerization initiation than others. In general, polymerization of $(SN)_x$ products has been accomplished based upon the clear or normal $S_2N_2$ fraction. Separation of these fractions has generally been accomplished by high vacuum fractionation at low temperatures. Fractionation conditions and temperatures of the collection traps vary somewhat in the studies to date from preparation to preparation depending presumably on local pressure, flow rate and relative amounts of the mixed products. Multiple fractionation is sometimes required. In the course of this fractionation and trap to trap transfer, crystals of both red and brown decomposition fractions have been polymerized and over a period of time have formed the golden, lustrous $(SN)_x$ crystals. Conventionally, clear $S_2N_2$ polymerizes at 0° C. and above over a period generally on the order of months into a golden, lustrous electrically conductive product. In reaching this diamagnetic state, the $S_2N_2$ initially goes through a blue black state.

In the photoinduced polymerization initiation of the present invention, it is this conversion of $S_4N_4$ into a colored state, believed to be paramagnetic, which is generally taken as an indication of the success of photoinduced polymerization initiation. In general, this photoinduced initiation of polymerization has been conducted at low temperatures, on the order of $-25°$ C. to $-60°$ C., at which temperatures the $S_2N_2$ decomposition fraction did not otherwise show any tendency to polymerize spontaneously.

It may be that in utilization of the present invention to induce polymerization or selective polymerization of an irradiated area, this initiation process would be conducted at low temperatures so as to prevent competing spontaneous polymerization. In most cases, the long-term polymerization following initiation thereof has been conducted in the experiments to date, and may be conducted on an industrial scale, at an elevated temperature, as compared to that at which the photoinduced polymerization is accomplished.

By way of example, photoinduced polymerization initiation may be accomplished at $-25°$ C. to $-60°$ C. for a short time on the order of seconds to minutes and the material with polymerization thus triggered then raised to a higher temperature on the order of 0° C. to complete the polymerization process. Many other combinations of temperature and time and intensity of irradiation may be utilized to obtain similar results. In the examples below, it is indicated that a tungsten lamp in one instance and a xenon arc lamp in another instance have been found effective to produce sufficient radiation in the visible to UV range for photoinduced initiation of $(SN)_x$. However, it is believed that other equally useful light sources include mercury arc and deuterium arc lamps and lasers adapted to emit high intensity light in the visible to UV range. Other sources also considered to be likely to be capable of initiating and/or enhancing $(SN)_x$ polymerization are sources of radiation, beyond the ultraviolet portion of the spectrum, namely in the X-ray and gamma ray portion of the spectrum, the latter typified by cobalt-60 emission, such has been used to selectively polymerize methyl methacrylate.

The effectiveness of such light or radiation induced polymerization or polymerization initiation may depend not only on the intensity of the radiation but also on some characteristics of material to be radiated. And particularly, the inclusion of photosensitizing compounds may sensitize the $(SN)_x$ precursors to photoinduced polymerization or polymerization initiation at much lower radiation intensities or may accelerate the effects thereof.

When photoinduced polymerization, in accordance with the present invention, is produced in solvent collected $S_2N_2$, the solvent used in the collection of the thermolysis product may be removed before or after irradiation. Various solvents may be suitable for collection of $S_2N_2$ thermolysis products. Tetrahydrofuran has been utilized in accordance with the example described below. Substantially any other solvent may be used for this purpose, however, so long as, apart from its solubility for $S_4N_4$ thermolysis products, it does not otherwise physically or chemically interact with these products and demonstrates sufficient solubility for the products at the temperature of collection. If it is intended to remove the products from solution before irradiation, the solvent must, of course, also have sufficient temperature dependency of solubility to permit crystallization and separation.

One very promising potential use of the present invention is believed to be that in which a $S_4N_4$ decomposition product would be deposited as a thin coating on an electrically non-conductive substrate. Thereafter, polymerization would be initiated in a preselected pattern on the substrate by irradiating through an irradiation mask. Non-irradiated monomer would then be removed and polymerization allowed to go to completion to produce an electrically conductive coating in a preselected pattern on the non-conductive substrate. Alternatively, $S_4N_4$ decomposition products may also be dispersed in a matrix, e.g. a photographic emulsion which is transparent or partially transparent to light, or which may be rendered partially or selectively transparent or opaque. This might be useful, for example, for imaging applications, or for producing a selectively transparent pattern for subsequent photoinduced initiation of polymerization of the $S_4N_4$ products.

The following are three examples demonstrating the photoinduced polymerization initiation of $S_2N_2$ to form $(SN)_x$.

EXAMPLE 1

Crystals of $S_2N_2$ were collected in a solution of $S_2N_2$ in tetrahydrofuran. In this solution, the crystals were formed by programmed cooling from $-21°$ C. to $-35°$ C.

In this experiment, the $S_2N_2$ crystals were irradiated with an 18 watt tungsten microscope lamp.

The $S_2N_2$ crystals grown in tetrahydrofuran darkened in about one minute at $-35°$ C. Within five minutes most of the crystals were darkened and were essentially opaque black. At this stage, some of the tetrahydrofuran solvent was removed slowly by distillation in vacuo, and concurrently the temperature of the bath was raised to $-24°$ C. After about two weeks the golden lustrous appearance of $(SN)_x$ crystals was noted. Thereafter, the bath temperature was increased to $0°$ C. at $1°$ C. per hour and all tetrahydrofuran removed. After two months at $0°$ C., the crystals were warmed to room temperature slowly, and annealed in a helium atmosphere for two hours at about $75°$ C. for study of physical properties. Among the physical properties observed was an electrical conductivity, $\sigma$, at room temperature of about 2,000 ohms$^{-1}$cm$^{-1}$. The value of $\sigma/\sigma$ room temperature at $13°$ K. was about 250. This material was further indicated to undergo a superconducting transition comparable to that of vapor phase grown cystals of $(SN)_x$.

EXAMPLE 2

Solution grown $S_2N_2$ crystals were prepared from a 6 mg. $S_2N_2$/ml tetrahydrofuran solution by reducing the temperature from $-21°$ C. to $-60°$ C. to form the crystals whereupon the tetrahydrofuran solvent was removed slowly by distillation.

The dry solvent collected $S_2N_2$ crystals were then illuminated with an 18 watt tungsten lamp and within about 4 minutes the initially precipitated crystals darkened indicating initiation of polymerization. Thereafter, the remaining crystals darkened slowly after about three weeks and the darkened crystals proceeded to complete polymerization in a matter of one to two months.

EXAMPLE 3

A sample of $S_2N_2$ crystals condensed in vacuo at $-10°$ C. was cooled slowly to $-57°$ C. and then illuminated with a tungsten source yielding no detectable photopolymerization. Thereafter, illumination with an 150 watt xenon arc lamp yielded darkened crystals in discrete sections of the sample after about 15 minutes. Thereafter, the crystals were permitted to warm slightly and proceeded to a fully polymerized state over a period of one to two months.

It will be appreciated from the foregoing that the photoinduced polymerization initiation improvement in the $(SN)_x$ growing process according to the present invention may be effected at a reduced temperature at which polymerization initiation is enhanced to the point of producing polymerization when it would not spontaneously otherwise occur. The photoinduced polymerization may then be followed by slight warming of the crystals to permit polymerization at a temperature more conducive to polymerization.

Alternatively, photoinduced polymerization may be accomplished at a temperature at which some spontaneous polymerization would otherwise occur. In either event, the photoinduced initiation is effective to enhance the initiation of the polymerization reaction.

While this invention has been described with reference to particular embodiments and examples thereof, it is not limited thereto and the appended claims are intended to be construed to encompass all other variations and modifications of the present invention which may be made by those skilled in the art without departing from the true spirit and scope hereof.

Having described our invention, we desire to claim and secure by letters patent, the following:

1. In the method of making $(SN)_x$ consisting of thermally decomposing $S_4N_4$ in the presence of silver wool, collecting the products thereof and holding said products at a sufficiently high temperature a sufficient period of time to permit substantially complete polymerization thereof, the improvement consisting of irradiating at least a fraction of said collected $S_4N_4$ decomposition products with radiation in the $\gamma$ ray to visible light range at an intensity sufficient to enhance the initiation of polymerization of said irradiated products.

2. An improved method, as recited in claim 1, wherein said decomposition products are fractionated prior to irradiation thereof.

3. An improved method, as recited in claim 2, wherein a substantially clear $S_2N_2$ fraction is separated from said decomposition products for subsequent irradiation and polymerization as claimed.

4. An improved method, as recited in claims 1, 2 or 3, wherein said decomposition products are collected by crystallization from the vapor phase.

5. An improved method, as recited in claims 1, 2 or 3, wherein said decomposition products are collected in a solvent therefor, irradiated while in solution therewith, and removing said solution after initiation of polymerization thereof.

6. An improved method, as recited in claims 1, 2 or 3, wherein said decomposition products are collected in a solvent therefor and then crystallized by removal of solvent therefrom prior to irradiation thereof.

7. An improved method, as recited in claims 1, 2 or 3, wherein said products to be irradiated are disposed as a coating on a substantially inert electrically non-conductive substrate therefor and preselected portions of said coating are masked to prevent irradiation thereof, the unmasked portions being irradiated and polymerized as claimed.

8. An improved method, as recited in claim 7, wherein said masked portion of said coating is removed from said substrate after the initiation of polymerization of said unmasked portion.

9. An improved method, as recited in claims 1, 2 or 3, wherein said products to be irradiated are dispersed in a matrix material.

10. An improved method, as recited in claim 9, wherein said matrix material is a photographic emulsion.

11. A product consisting of an electrically non-conductive substrate having disposed thereon in a preselected pattern, an electrically conductive coating, said product having been produced by a process as recited in claim 7.

* * * * *